United States Patent
Kim

(10) Patent No.: US 6,762,100 B2
(45) Date of Patent: Jul. 13, 2004

(54) MASK ROM CELL AND METHOD OF FABRICATING THE SAME

(75) Inventor: Jin Soo Kim, Chungcheongbuk-do (KR)

(73) Assignee: LG Semicon, Chungcheongbuk-do (KR)

( * ) Notice: Subject to any disclaimer, the term of this patent is extended or adjusted under 35 U.S.C. 154(b) by 0 days.

(21) Appl. No.: 10/364,399

(22) Filed: Feb. 12, 2003

(65) Prior Publication Data

US 2003/0111696 A1 Jun. 19, 2003

Related U.S. Application Data

(62) Division of application No. 09/150,024, filed on Sep. 9, 1998, now Pat. No. 6,555,881.

(30) Foreign Application Priority Data

Dec. 30, 1997 (KR) .............................. 97-79128

(51) Int. Cl.$^7$ ........................................... H01L 21/8234

(52) U.S. Cl. ........................ 438/275; 438/276; 438/278

(58) Field of Search .............................. 438/275, 276, 438/277, 278; 257/390, 391

(56) References Cited

U.S. PATENT DOCUMENTS

| | | | |
|---|---|---|---|
| 4,255,210 A | 3/1981 | Okuyama et al. | 148/187 |
| 5,032,881 A | 7/1991 | Sardo et al. | 357/23.5 |
| 5,308,781 A | 5/1994 | Ando et al. | 257/390 |
| 5,504,030 A | 4/1996 | Chung et al. | 437/52 |
| 5,670,402 A | 9/1997 | Sogawa et al. | 437/48 |
| 5,824,585 A | * 10/1998 | Wen | 438/275 |
| 5,846,865 A | * 12/1998 | Sheng et al. | 438/276 |

FOREIGN PATENT DOCUMENTS

JP  60-1863  1/1985

* cited by examiner

Primary Examiner—Phat X. Cao
Assistant Examiner—Theresa T. Doan
(74) Attorney, Agent, or Firm—Morgan, Lewis & Bockius LLP

(57) ABSTRACT

Mask ROM cell and method of fabricating the same, is disclosed, including a semiconductor substrate of a first conductivity type, a plurality of impurity diffusion regions of a second conductivity type, formed in the semiconductor substrate in one direction, having a predetermined distance therebetween, an insulating layer formed on a portion of the semiconductor substrate, corresponding to each impurity diffusion region, a gate insulating layer formed on the semiconductor substrate, and a plurality of conductive lines formed on the gate insulating layer and insulating layer in a predetermined interval, being perpendicular to the impurity diffusion regions.

8 Claims, 6 Drawing Sheets

MASK ROM CELL AND METHOD OF FABRICATING THE SAME

This is a divisional of Application Ser. No. 09/150,024 filed on Sep. 9, 1998, now U.S. Pat. No. 6,555,881.

BACKGROUND OF THE INVENTION

1. Field of the Invention

The present invention relates to a semiconductor device and method of fabricating the same and, more particularly, to a mask ROM cell and method of fabricating the same, which prevents short channel effect.

2. Discussion of Related Art

In general, a mask ROM is composed of combination of a depletion transistor and enhanced transistor. The depletion transistor has negative threshold voltage according to depletion ion implantation, and is turned on when 0V is applied to its gate electrode. The enhanced transistor is formed in a manner that count-doping is performed to the channel region of the depletion transistor through code ion implantation, to have approximately 0.7V of threshold voltage, serving as the OFF transistor of mask ROM.

A conventional mask ROM cell and method of fabricating the same are explained below with reference to the attached drawings. FIG. 1 is a perspective view of a conventional mask ROM. As shown in FIG. 1, a plurality of impurity diffusion regions 13 are formed in a P-type semiconductor substrate. 11 in one direction, having a predetermined distance therebetween, and a gate insulating layer 14 is formed on semiconductor substrate 11. A plurality of gate lines 15a are formed on gate insulating layer 14 in a predetermined interval, being perpendicular to plurality of impurity diffusion regions 13. In the formation of the gate insulating layer, thermal oxide layer 14a formed on each impurity diffusion region 13, is thicker than portions of the gate insulating layer, placed on region except the impurity diffusion regions.

FIGS. 2A to 2D are cross-sectional views showing a method of fabricating the conventional mask ROM cell. Referring to FIG. 2A, B⁺ impurity ion is implanted into the overall surface of P-type semiconductor substrate 11 for controlling the threshold voltage. Referring to FIG. 2B, a photoresist 12 is coated on semiconductor substrate 11, and patterned through exposure and development. High-concentration N-type impurity ion implantation is carried out to the overall surface of semiconductor substrate 21 using the patterned photoresist 12, to form plurality of impurity diffusion regions 13 in semiconductor substrate 11 in one direction, having a specific distance therebetween.

Referring to FIG. 2C, photoresist 12 is removed, and thermal oxidation is performed to the surface of semiconductor substrate 11 in which plurality of impurity diffusion regions 13 are formed, forming gate insulating layer 14. Here, thermal oxide layer 14a formed on impurity diffusion regions 13 formed by the impurity implantation, is thicker than portions of gate insulating layer 14, placed on the region other except impurity diffusion regions. A polysilicon layer 15 is formed on the overall surface of semiconductor substrate 11 including gate insulating layer 14. Referring to FIG. 2D, a photoresist (not shown) is coated on polysilicon layer 15, and patterned through exposure and development. Polysilicon layer 15 is selectively removed using the patterned photoresist as a mask, to form plurality of gate lines 15a which are perpendicular to plurality of impurity diffusion regions 13.

In the aforementioned conventional mask ROM cell and method of fabricating the same, however, the impurities included in the impurity diffusion regions are diffused when the semiconductor substrate is thermally oxidized to form the gate insulating layer, so as to shorten the distance between the impurity diffusion regions. This brings about short channel effect which reduces the channel region. Thus, there is a limitation in decreasing the cell size.

SUMMARY OF THE INVENTION

Accordingly, the present invention is directed to a mask ROM cell and method of fabricating the same that substantially obviates one or more of the problems due to limitations and disadvantages of the related art.

An object of the present invention is to provide a mask ROM and method of fabricating the same, which prevents the short channel effect, to reduce the size of mask ROM cell.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the mask ROM cell includes: a semiconductor substrate of a first conductivity type; a plurality of impurity diffusion regions of a second conductivity type, formed in the semiconductor substrate in one direction, having a predetermined distance therebetween; an insulating layer formed on a portion of the semiconductor substrate, corresponding to each impurity diffusion region; a gate insulating layer formed on a portion of the semiconductor substrate, placed between the impurity diffusion regions; and a plurality of conductive lines formed on the gate insulating layer and insulating layer in a predetermined interval, being perpendicular to the impurity diffusion regions.

The method of fabricating the mask ROM cell includes the steps of: preparing a semiconductor substrate of a first conductivity type; forming a plurality of impurity diffusion regions of a second conductivity type in the semiconductor substrate in one direction, having a predetermined distance therebetween; forming an insulating layer on a portion of the semiconductor substrate, corresponding to each impurity diffusion region; forming a gate insulating layer on the semiconductor substrate; and forming a plurality of conductive lines on the gate insulating layer and insulating layer in a predetermined interval, the gate lines being perpendicular to the impurity diffusion regions.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
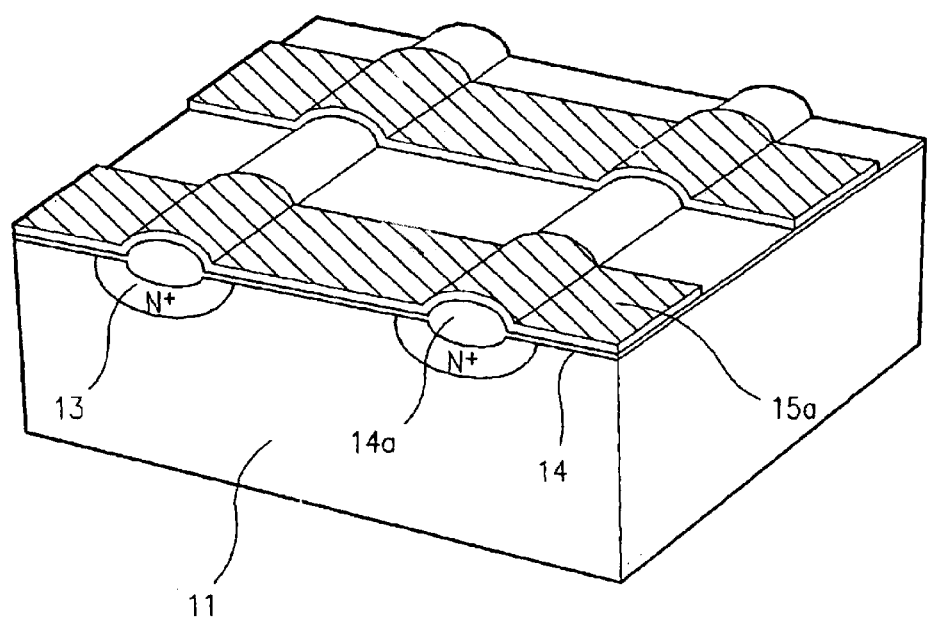
FIG. 1 is a perspective view of a conventional mask ROM cell.
Figure 2A:
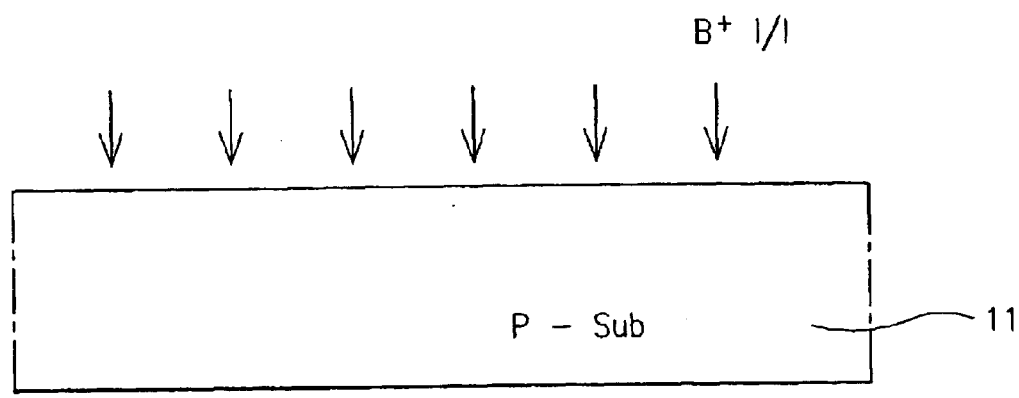
FIGS. 2A to 2D are cross-sectional views showing a method of fabricating the conventional mask ROM cell.
Figure 2B:
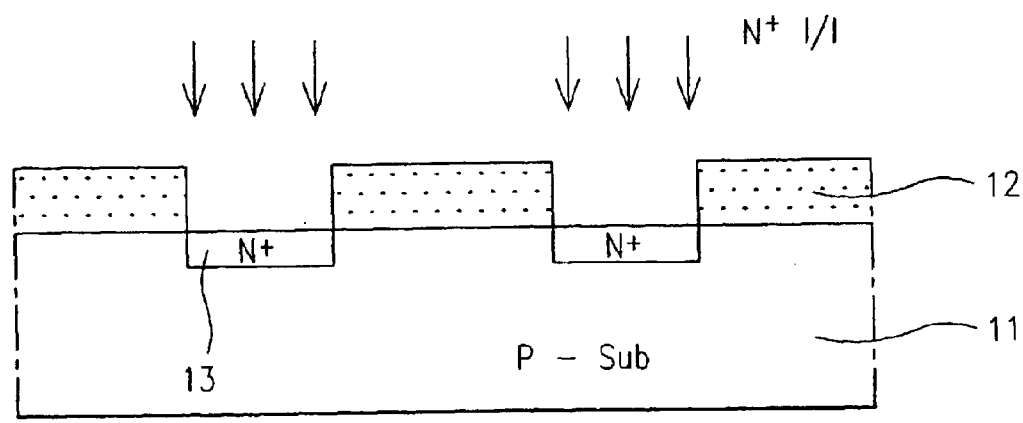
Figure 2C:
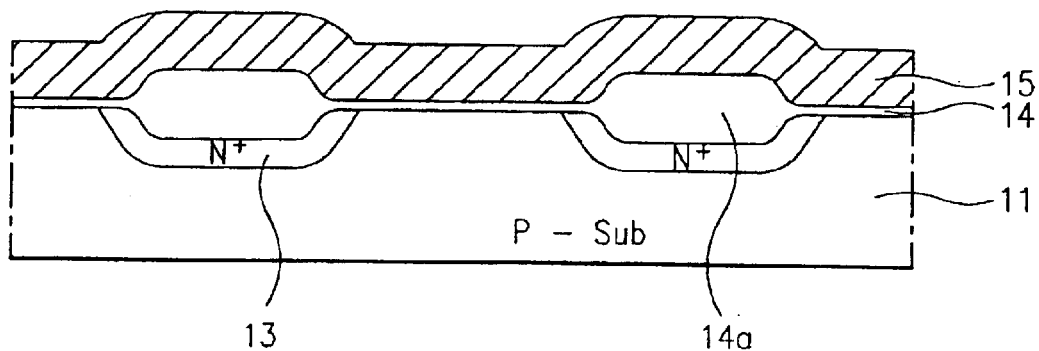
Figure 2D:
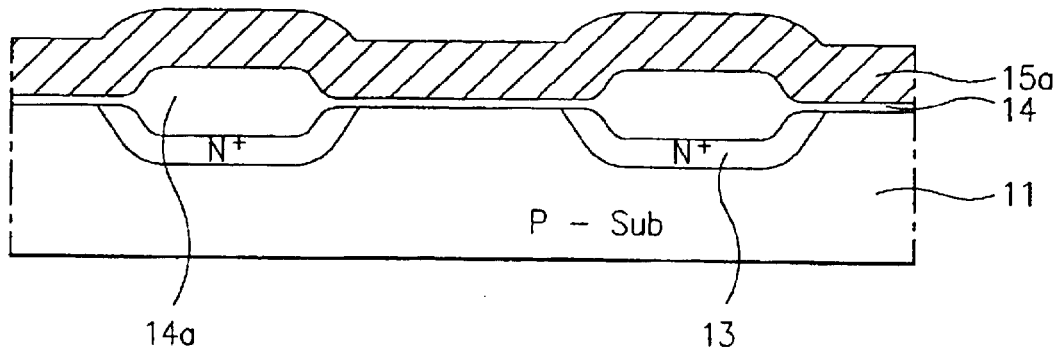
Figure 3:
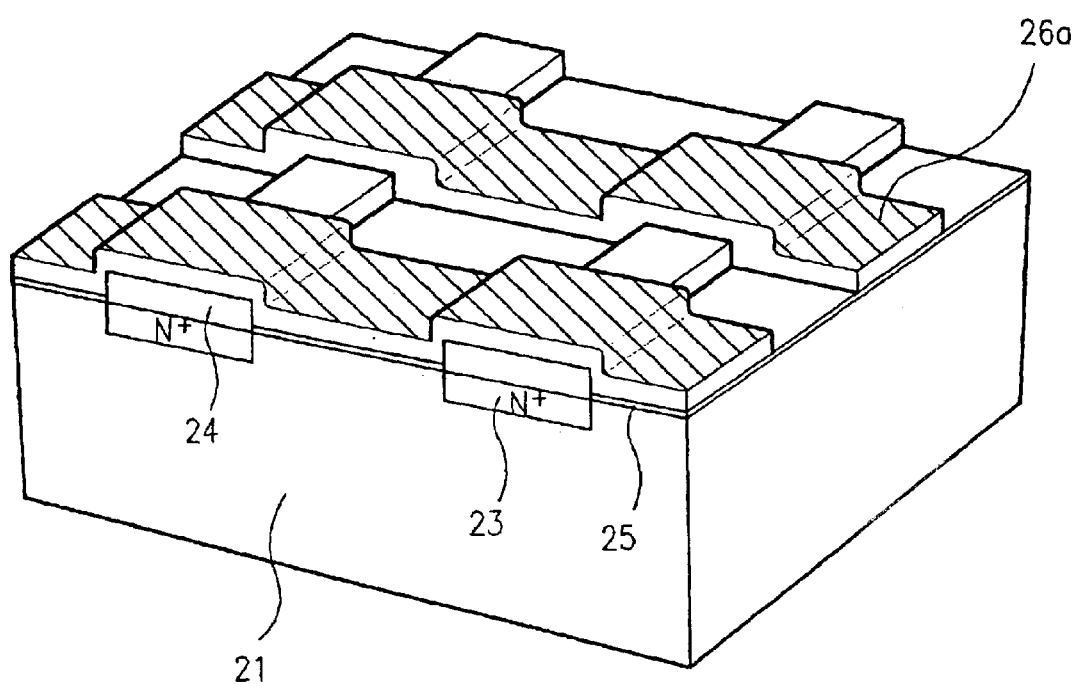
FIG. 3 is a perspective view of a mask ROM cell according to the present invention.

FIG. 3 is a perspective view of a mask ROM cell according to the present invention. As shown in FIG. 3, a plurality of impurity diffusion regions 23 are formed in a P-type semiconductor substrate 21 in one direction, having a predetermined distance therebetween, and an insulating layer 24, such as CVD oxide layer or nitride layer, is formed on a portion of semiconductor substrate 21, corresponding to each impurity diffusion region 23. A gate insulating layer 25 is formed on a portion of semiconductor substrate 21, placed between impurity diffusion regions 23, and a plurality of gate lines 26a are formed of polysilicon on insulating layer 24 and gate insulating layer 25 in a predetermined interval, being perpendicular to impurity diffusion regions 23.

Figure 4A:
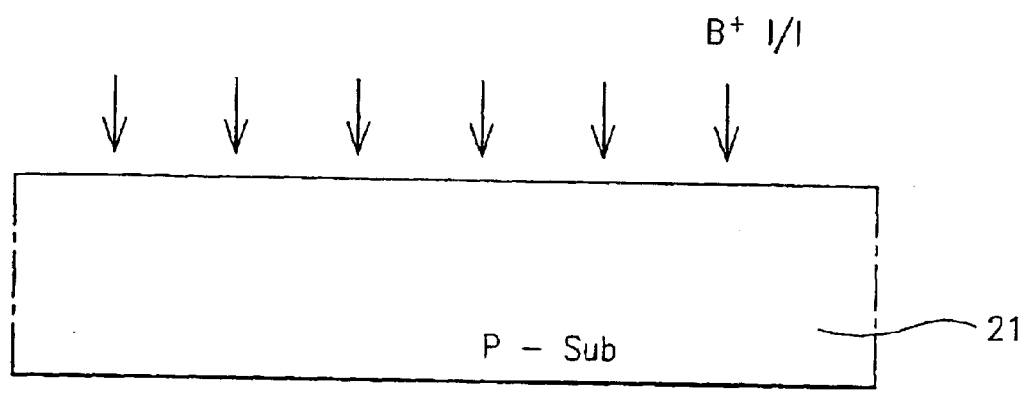
FIGS. 4A to 4D are cross-sectional views showing a method of fabricating the mask ROM cell according to the present invention.
Figure 4B:
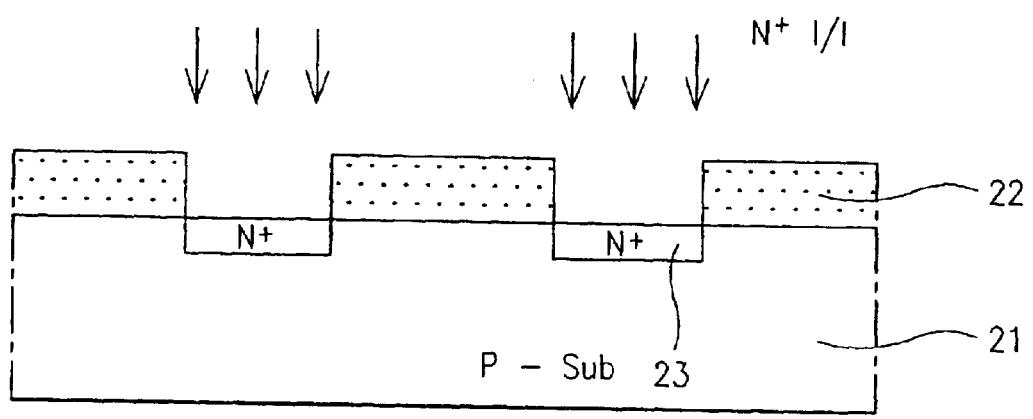

FIGS. 4A to 4D are cross-sectional views showing a method of fabricating the mask ROM cell according to the present invention. Referring to FIG. 4A, B+ impurity ion is implanted into the overall surface of P-type semiconductor substrate 21 for controlling the threshold voltage. Referring to FIG. 4B, a photoresist 22 is coated on semiconductor substrate 21, and patterned through exposure and development. High-concentration N-type impurity ion implantation is carried out to the overall surface of semiconductor substrate 21 using the patterned photoresist 22 as a mask, to form plurality of impurity diffusion regions 23 in semiconductor substrate 21 in one direction, having a specific distance therebetween.

Figure 4C:
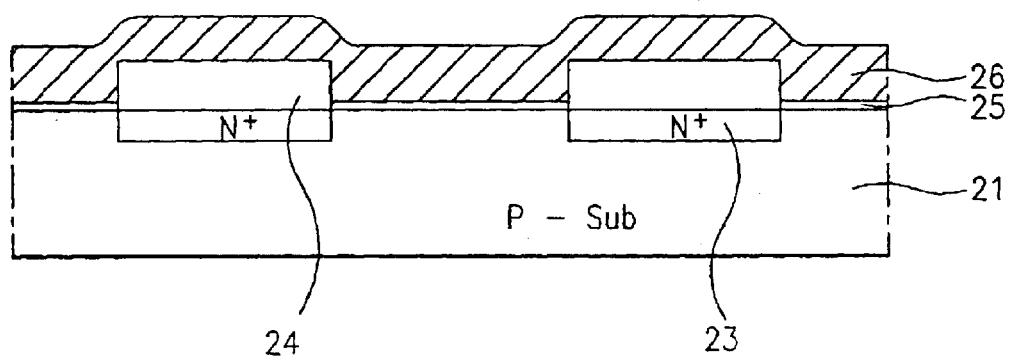

Referring to FIG. 4C, photoresist 22 is removed, and insulating layer 24, such as CVD oxide layer or nitride layer, is formed on the overall surface of semiconductor substrate 21 in which plurality of impurity diffusion regions 23 are formed. A photoresist (not shown) is coated on insulating layer 24, and patterned. Insulating layer 24 is patterned using the patterned photoresist as a mask. Here, insulating layer 24 is formed in the direction of impurity diffusion regions 23, and patterned to be left on a portion of semiconductor substrate 21, corresponding to each impurity diffusion region.

Figure 4D:
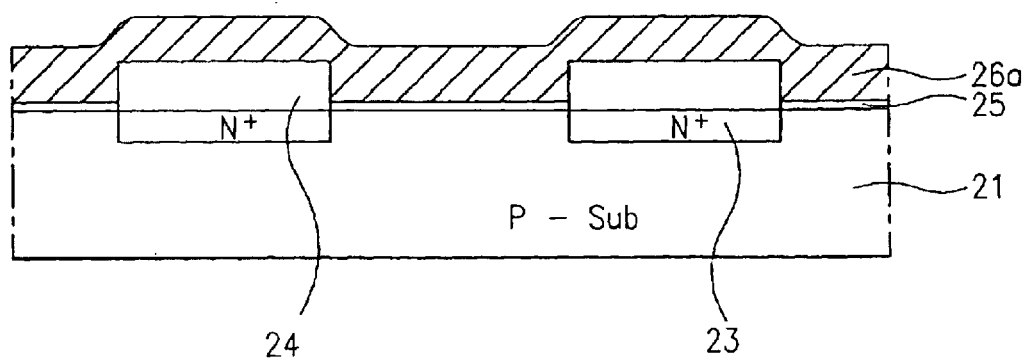

Thermal oxidation is carried out to the overall surface of semiconductor substrate 21 using insulating layer 24 as a mask, to form gate insulating layer 25 on a portion of semiconductor substrate 21, placed between impurity diffusion regions 23. Gate insulating layer 25 may be formed by depositing an insulating layer on the overall surface of semiconductor substrate 21 including insulating layer 24. Thereafter, a polysilicon layer 26 is formed on the overall surface of semiconductor substrate 21 including gate insulating layer 25. Referring to FIG. 4D, a photoresist (not shown) is coated on polysilicon layer 26, and patterned through exposure and development. Polysilicon layer 26 is patterned using the patterned photoresist as a mask, forming a plurality of gate lines 26a in a predetermined interval.

Here, plurality of gate lines 26a are perpendicular to impurity diffusion regions 23.

As described above, the present invention forms the insulating layer on the portion of the semiconductor substrate, corresponding to the impurity diffusion region, and then the gate insulating layer is formed through thermal oxidation using the insulating layer as a mask. Accordingly, the width of each impurity diffusion region is maintained uniformly, to prevent the short channel effect, thereby remarkably reducing the size of mask ROM cell.

It will be apparent to those skilled in the art that various modifications and variations can be made in the mask ROM and method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a mask ROM cell, comprising the steps of:

preparing a semiconductor substrate of a first conductivity type;

forming a plurality of impurity diffusion regions of a second conductivity type in a surface of the semiconductor substrate in one direction, having a predetermined distance and free of other impurity diffusion regions therebetween;

forming an insulating layer completely above the surface of semiconductor substrate and entirely covering a portion of the semiconductor substrate surface corresponding to each impurity diffusion region;

forming another insulating layer only on a portion of the semiconductor substrate between the impurity diffusion regions, whereby the other insulating layer is a gate insulating layer; and forming a plurality of conductive lines on and in contact with both the gate insulating layer and insulating layer in a predetermined interval, the gate lines being perpendicular to the impurity diffusion regions.

2. The method as claimed in claim 1, wherein the semiconductor substrate is P-type, and the impurity diffusion regions are formed by implanting N-type impurity ions into the semiconductor substrate.

3. The method as claimed in claim 1, wherein the gate insulating layer is formed through thermal oxidation.

4. The method as claimed in claim 1, wherein the insulating layer is formed of CVD oxide or nitride.

5. The method as claimed in claim 1, wherein the conductive lines are formed of polysilicon.

6. The method as claimed in claim 1, wherein each insulating layer serves as a mask to corresponding each corresponding impurity diffusion region for maintaining the width of each impurity diffusion region uniformly during the formation of the gate insulating layer.

7. A method of fabricating a mask ROM cell, comprising the steps of:

forming a plurality of impurity diffusion regions in a surface of a semiconductor substrate in one direction, having a distance and free of other impurity diffusion regions therebetween;

forming first insulating layers completely above the surface of the semiconductor substrate and entirely covering portions of the semiconductor substrate surface corresponding to respective impurity diffusion regions;

forming second insulating layers on portions of the semiconductor substrate between the first insulating layers as gate insulating layers; and forming a plurality of conductive lines on and in contact with both the gate insulating layers and the first insulating layers.

8. The method as claimed in claim 7, wherein the step of forming the first insulating layers includes a step of using each insulating layer as a mask to cover each corresponding impurity diffusion region for maintaining the width of each impurity diffusion region uniformly during the formation of the gate insulating layers.

* * * * *